United States Patent
Zhang et al.

(10) Patent No.: US 7,200,835 B2
(45) Date of Patent: Apr. 3, 2007

(54) METHOD OF LOCATING SUB-RESOLUTION ASSIST FEATURE(S)

(75) Inventors: Guohong Zhang, Plano, TX (US); Sean O'Brien, La Hulpe (BE)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 11/340,251

(22) Filed: Jan. 25, 2006

(65) Prior Publication Data

US 2006/0190919 A1 Aug. 24, 2006

Related U.S. Application Data

(60) Provisional application No. 60/655,956, filed on Feb. 24, 2005.

(51) Int. Cl.
*G06F 17/50* (2006.01)
*G06F 19/00* (2006.01)
*G21K 5/00* (2006.01)
*G03F 1/00* (2006.01)

(52) U.S. Cl. ............................ 716/21; 430/5; 378/35; 700/119; 700/121

(58) Field of Classification Search ................ 716/21; 430/5; 378/35; 700/119, 121
See application file for complete search history.

(56) References Cited

U.S. PATENT DOCUMENTS

| | | | |
|---|---|---|---|
| 6,887,625 B2* | 5/2005 | Baselmans et al. | 430/5 |
| 6,918,104 B2* | 7/2005 | Pierrat et al. | 716/19 |
| 7,055,127 B2* | 5/2006 | Pierrat et al. | 716/19 |
| 7,074,525 B2* | 7/2006 | Wu et al. | 430/5 |
| 2002/0045106 A1* | 4/2002 | Baselmans et al. | 430/5 |
| 2002/0155357 A1* | 10/2002 | LaCour | 430/5 |
| 2002/0197546 A1* | 12/2002 | Pierrat | 430/5 |
| 2003/0018948 A1* | 1/2003 | Chang et al. | 716/8 |
| 2003/0110460 A1* | 6/2003 | Pierrat et al. | 716/4 |
| 2004/0010768 A1* | 1/2004 | Toublan et al. | 716/21 |
| 2004/0170905 A1* | 9/2004 | Liebmann et al. | 430/5 |
| 2004/0191650 A1* | 9/2004 | Pierrat | 430/5 |
| 2004/0248016 A1* | 12/2004 | Lucas et al. | 430/5 |
| 2005/0044513 A1* | 2/2005 | Robles et al. | 716/4 |
| 2005/0149900 A1* | 7/2005 | Laidig | 716/19 |
| 2006/0218520 A1* | 9/2006 | Pierrat et al. | 716/19 |
| 2006/0240342 A1* | 10/2006 | Tang | 430/5 |

* cited by examiner

*Primary Examiner*—Phallaka Kik
(74) *Attorney, Agent, or Firm*—Peter K. McLarty; W. James Brady, III; Frederick J. Telecky, Jr.

(57) ABSTRACT

A method of operating a computing system to determine reticle data. The reticle data is for completing a reticle for use in projecting an image to a semiconductor wafer. The method receives circuit design layer data comprising a desired circuit layer layout, and the layout comprises a plurality of lines. The method also identifies in the plurality of lines a first line portion for use as a first circuit function and a second line portion for use as a second circuit function that differs from the first circuit function. The first line portion is parallel and adjacent to the second line portion. The method also provides the reticle data in an output data file for use in forming features on the reticle. The method also indicates parameters for forming first and second primary features as well as at least one assist feature on the reticle having an area between the first primary feature and the second primary feature, wherein in use of the reticle for use in projecting the image to the semiconductor wafer the area will favor greater assistance to the first primary feature as compared to the second primary feature.

47 Claims, 6 Drawing Sheets

METHOD OF LOCATING SUB-RESOLUTION ASSIST FEATURE(S)

CROSS-REFERENCES TO RELATED APPLICATIONS

This application claims priority under 35 U.S.C. § 119 of U.S. Provisional Application No. 60/655,956, filed Feb. 24, 2005.

STATEMENT REGARDING FEDERALLY SPONSORED RESEARCH OR DEVELOPMENT

Not Applicable.

BACKGROUND OF THE INVENTION

The present embodiments relate to forming semiconductor circuit wafers and are more particularly directed to locating sub-resolution assist features ("SRAF") on a mask (or reticle) for use with such wafers.

The history and prevalence of semiconductor devices are well known and have drastically impacted numerous electronic devices. As a result and for the foreseeable future, successful designers constantly are improving the semiconductor fabrication process, and improvements are in numerous areas including device size, fabrication efficiency, and device yield. The present embodiments advance these and other goals by improving the methodology for developing parameters to implement sub-resolution assist features on the masks used to form semiconductor devices.

By way of background and as known in the art, semiconductor devices are sometimes referred to as chips, and each chip is created from a portion of a semiconductor wafer. Typically, each chip is located in a respective area on the wafer referred to as a field. Various fabrication steps are taken to form electric circuits on each field. Some of these steps involve photolithography, whereby a light source is directed toward a mask, and light passes through only portions of the mask because so-called features have been previously formed on the mask so that the light that passes is determined by the location of the features. In other words, an image is projected through the mask based on the location of the features, where in some cases the feature is what blocks the light or in other cases the feature is what passes the light. In either case, typically the light image is further directed to a reduction lens that reduces the size of the image and the reduced image is then projected to a selected field on the wafer, where the field selection is determined by a device known as a stepper. The stepper gets its name because it causes the image to step through different fields on the wafer, that is, once the image is projected to one field on the wafer, the stepper disables the light source, repositions either the mask or the wafer, and then enables the light source so that the same image from the same mask is then directed to a different field on the wafer, and so on for numerous fields. Thus, this process repeats until numerous images of the same type are directed to numerous respective fields on the wafer, with the stepper thereby stepping the image from one field to another on the wafer. As each image reaches a field on the wafer, typically the light reacts with a layer of photoresist that was previously deposited on the wafer. The resulting reacted photoresist layer is then etched to remove the unreacted photoresist, leaving behind structures on the wafer that correspond to the same size and shape as the reduced light that previously was directed through the mask and reducer to the wafer. These remaining wafer structures are also referred to as features and note, therefore, that each feature on the mask causes a corresponding feature on the wafer. However, each feature on the mask is larger in size, typically by some integer multiple (e.g., 2, 4, 5, 10), where the multiplier is removed with respect to the wafer by the reducer lens. For example, in a case where the mask features are four times that desired on the wafer, the reducer lens reduces the size of the light image passing through the mask by a factor of four so that each resulting wafer feature will be one-fourth the size (in all dimensions) of each respective mask feature. In this manner, therefore, limitations on the mask may be at a larger size scale than on the wafer, due to the use of the reducer lens.

Given the use of imaging and masks as discussed above, various aspects of semiconductor design are necessarily limited by constraints of the mask and its related technology. In other words, since the mask defines the image that passes through it and that ultimately dictates the layout of the circuit on the wafer, then limitations of the mask represent limitations of the resultant wafer circuit. For example, it is well known that features on the mask may be made only down to a certain limited width, which as of this writing are typically on the order of 250 nm. Moreover, in developing the location of features on a mask, various designers have developed methodologies that place limits on how closely two neighboring features may be formed. More specifically, it has been determined that if such neighboring features are too closely formed, then the features cannot be resolved optically with conventional light source and mask techniques, causing an undesirable or unacceptable image on the wafer. Such limitations are particularly evident when a desired dimension of a wafer feature is smaller than the wavelength of the light that passes through the mask. In this regard, more recently technology has advanced with the use of two techniques that permit creation of even smaller features, each of which is described below.

One technology used for improving wafer features in smaller circuits is known as a phase-shifting mask. In such a mask, the mask blocks light in certain areas and phase shifts light in other nearby areas typically so that the light passing through these latter areas is 180 degrees out of phase with respect to the areas that pass non-phase shifted light. As a result, there is overlap between the non-phase shifted and phase shifted light, causing light interference that effectively cancels some of the overlapping light and produces a clearer edge for the resulting wafer feature.

Another mask technology used for improving wafer features in smaller circuits is known by various names, such as feature assist, assist features, or sub-resolution assist feature ("SRAF") where the last connotes that the assisting feature on the mask when used with off-axis illumination contributes to a corresponding wafer feature with greater resolution and printing margin than that otherwise obtainable for a given light wavelength. In any event, those assist features are features that are located on a mask, but a key goal of these features is that there is not a counterpart of the mask assist feature formed on the wafer. More particularly, ideally the mask assist feature is small enough and properly located on the mask so that that the assist feature is not transferred onto the wafer because the wafer features are below the dimensional resolution of the lithography system. However, the assist feature is also large enough so that that it does affect the passage of light and thereby impacts a nearby wafer feature, sometimes referred to in this context as a primary feature and that is formed therefore in response to a primary (non-assist) feature on the mask but is further defined by the light that is manipulated by the assist feature.

In view of the above, with assist (or SRAF) technology comes the complexity of a methodology for locating the assist features on the mask or reticle. Often such a method implements a rule-based computer program that considers various of the circuit attributes and layout dimensions so as to generate parameters that in turn are used to form both primary and assist features on the mask. The present embodiments, however, seek to improve upon such technology by permitting and forming certain assist features preferentially for more critical device features i.e. primary features on the mask, with the ability therefore to enhance the printability of corresponding primary features on the wafer, thereby reducing chip size, permitting greater device density per field, and improving yield for smaller dimension circuits. Various other benefits also may be ascertained by one skilled in the art, based on the remaining discussion set forth below. Thus, the prior art provides drawbacks in its limitations of achieving only certain primary feature definition and minimal wafer feature sizes, while the preferred embodiments improve upon these limitations as demonstrated below.

BRIEF SUMMARY OF THE INVENTION

In the preferred embodiment, there is a method of operating a computing system to determine reticle data. The reticle data is for completing a reticle for use in projecting an image to a semiconductor wafer. The method receives circuit design layer data comprising a desired circuit layer layout, and the layout comprises a plurality of lines. The method also identifies in the plurality of lines a first line portion for use as a first circuit function and a second line portion for use as a second circuit function that differs from the first circuit function. The first line portion is parallel and adjacent to the second line portion. The method also provides the reticle data an output data file for use in forming features on the reticle. This provision comprises indicating a location on the reticle where a first primary feature is to be formed, the first primary feature corresponding to the first line portion. This provision also comprises indicating a location on the reticle where a second primary feature is to be formed, the second primary feature corresponding to the second line portion. Finally, this provision also comprises indicating parameters for forming at least one assist feature on the reticle having an area between the first primary feature and the second primary feature, wherein in use of the reticle for use in projecting the image to the semiconductor wafer the area will favor greater assistance to the first primary feature as compared to the second primary feature.

Other aspects are also disclosed and claimed.

DETAILED DESCRIPTION OF THE INVENTION

Figure 1:
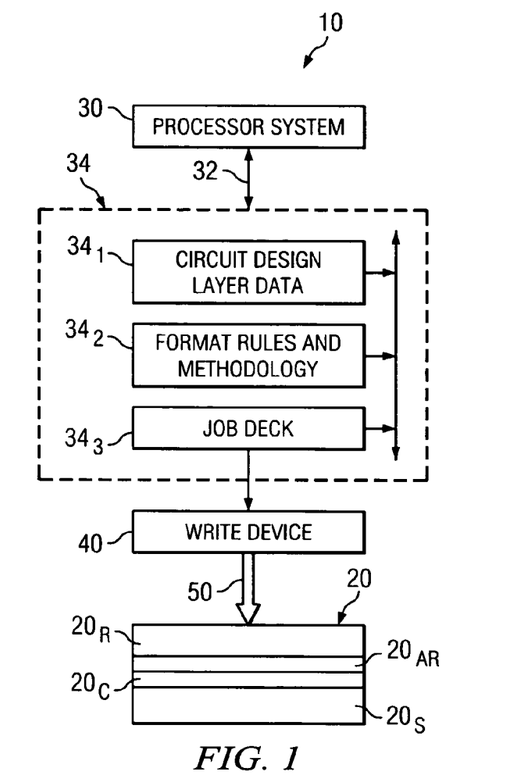
FIG. 1 illustrates a block diagram of a system for forming a reticle in accordance with the preferred embodiments.

FIG. 1 illustrates a block diagram of a system 10 for forming a reticle 20 in accordance with the preferred embodiments. By way of introduction, the general nature of system 10 is known in the art, but novel aspects are added thereto and improve reticle 20 for reasons appreciated throughout the remainder of this document.

Looking then to system 10 in general, it includes a processor system 30 that may be embodied in various different forms of hardware and software, typically including one or more processors and/or computing devices. Processor system 30 has one or more interfaces 32 coupled to a data store 34, where data store 34 represents any of various forms of storage such as drives and memory, and where such storage may retain program or other data that may be read/written with respect to processor system 30. Data store 34 is shown to provide two input data files $34_1$ and $34_2$ via interface 32 to processor system 30, and to receive an output data field $34_3$ from processor system 30, and each of these files is discussed below. Lastly, note that system 30 may include numerous other aspects such as are common with various computing configurations, including other input devices (e.g., keyboards, mouse, touch pad, tablet, and the like), output devices (e.g., display, monitor, and the like), as well as other media, components, devices, and peripherals, although such aspects are neither shown nor described so as to simplify the present discussion.

The first input data file $34_1$ from data store 34 to processor system 30 is designated circuit design layer data $34_1$. Data $34_1$ is a digitization of the desired circuit layer layout, thereby illustrating a desired image to be formed on reticle 20 so that a circuit layer may be formed later on a wafer in the same shape and with scaled dimensions of the image. Data $34_1$ is often created by one or more circuit designers, and indeed in some instances one company provides data $34_1$ to another company for creation of reticle 20 to correspond to data $34_1$. The circuit layer layout data of data $34_1$ typically has many shapes extending in various directions. Moreover, the layout pertains to a material used in the semiconductor fabrication process. One very common type of such material is a semiconductor, such as polysilicon. Another example is metal. In this example, therefore, data $34_1$ provides the layout shape and dimensions that are desired to be ultimately formed in a layer of polysilicon on a wafer or to establish metal lines on the wafer. For sake of simplifying the remaining discussion, the former example, that is of polysilicon, will be used, where one skilled in the art may apply various of the inventive aspects also to metal. In any event, other layer information is included in data $34_1$, and importantly as used in the preferred embodiments detailed below, data $34_1$ also may include information describing various structures in the layer data. Continuing with the example of a polysilicon layout, therefore, part of this information may indicate the circuit elements to be formed by the polysilicon. For example, polysilicon is often used to form the gate of a transistor and, thus, with the many transistors typically formed in a circuit design, the polysilicon layer may have numerous locations indicated as included for forming respective transistor gates throughout the layout. However, polysilicon elsewhere in the layout may have other uses, such as in resistors, capacitors, interconnect, or plasma etch load features. Thus, these other uses also may be described by information included in data $34_1$.

The second input data file $34_2$ from data store 34 to processor system 30 is designated format rules and methodology $34_2$ and in certain respects performs as known in the art. Specifically, file $34_2$ includes programming information, rules, and data that may take various forms ascertainable by one skilled in the art, such as computer (or processor) instructions/programming and appropriate parameters and data. File $34_2$, with the operation of processor system 30, formats input data $34_1$ into output data file $34_3$, sometimes referred to as a job deck, where output data file $34_3$ is later used to control a lithographic write by a write device 40; thus, write device 40 later and ultimately forms an image on reticle 20 and that corresponds to the layout described by data $34_1$. Looking then; to item $34_2$ in a little more detail, it is used by processor system 30 to convert the data from input file $34_2$ into a language compatible with write device 40, where this conversion is sometimes referred to as fracturing. The conversion divides the layout into shapes (e.g., rectangles and trapezoids) that are usable by write device 40. File $34_2$ also may make changes in size and rotation, add fiducials and internal references, and make other data alterations as known to one skilled in the art.

Continuing with second input data file $34_2$, it also includes additional novel aspects directed to the preferred embodiments. By way of introduction to these aspects, recall that the Background Of The Invention section of this document introduces sub-resolution assist features ("SRAF" or, plural, "SRAFs"). In this regard, second input data file $34_2$ also provides rules and a methodology, detailed later, which cause the inclusion of SRAFs into job deck file 343. SRAFs are features, referred to herein as assist features, that are not provided in data $34_1$, but in response to item $34_2$ are added to the job deck of output data file $34_3$ so that the SRAFs may be printed on reticle 20 in addition to the primary features that correspond to the layout in data $34_1$. As a result, when reticle 20 is later used to impinge an image on a semiconductor wafer, the SRAFs do not have a corresponding image on the wafer but assist in forming and defining better resolution and dimensions in the wafer features that correspond to the primary features on reticle 20.

Completing some observations with respect to system 10, the job deck output file $34_3$ is provided to a write device 40. Write device 40 controls either an electron beam or laser beam 50 so that it traces a beam across the surface of reticle 20 based on the data in job deck file $34_3$. Specifically, reticle 20 includes a substrate $20_S$, over which is a chrome layer $20_C$, over which is an anti-reflection layer $20_{AR}$, over which is a resist layer $20_R$. Write device 40 performs a lithographic process by controlling the beam so that it writes to resist layer $20_R$ an image, or "geometry," that follows the data in job deck file $34_3$, which recall should approximate that of circuit design layer data $34_1$ as modified per format rules and methodology $34_2$. As detailed below, format rules and methodology $34_2$ causes reticle SRAFs to be positioned strategically with respect to reticle primary features based on various considerations. In any event, the light in beam 50 reacts with resist layer $20_R$ in those areas where the write occurs. Thereafter, a developing process is performed so that any resist that has been so reacted, or "exposed," will be removed, leaving openings down to chrome layer $20_C$. Next, reticle 20 is etched, that is, the portions of anti-reflection layer $20_{AR}$ and chrome layer $20_C$ that are now exposed are removed. Finally, the unreacted portions of resist layer $20_R$ are removed, thereby leaving clear (or sometimes called "glass") areas through which light may pass in the areas that were etched, while also leaving portions of anti-reflection layer $20_R$ elsewhere. Accordingly, reticle 20 may now be used in connection with a stepper or the like so that light may be passed through the clear areas on reticle 20 toward a wafer (not shown), while the light is blocked by the portions where anti-reflection layer $20_{AR}$ remains, where such latter portions are often referred to as chrome, dark, or opaque. These remaining areas, therefore, include the reticle primary and assist features.

Figure 2A:
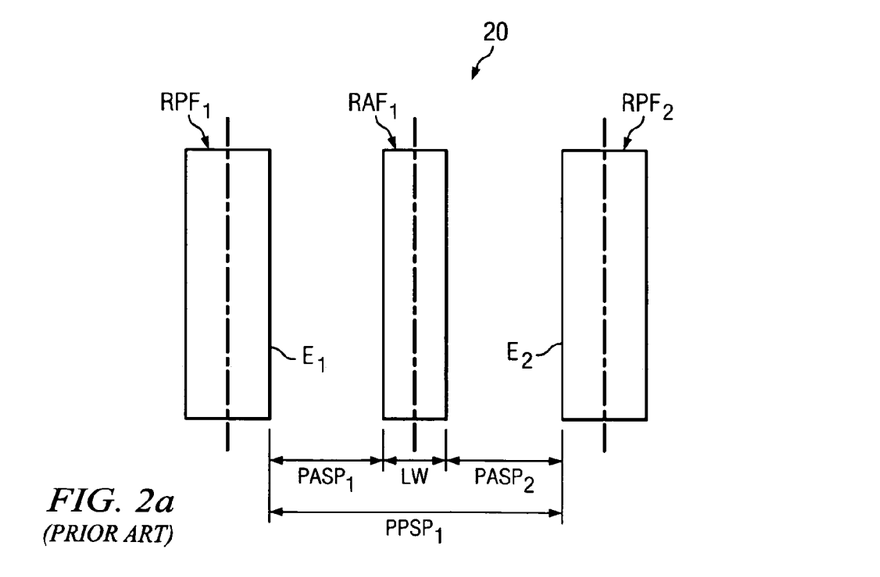
FIG. 2a illustrates a block diagram of a portion of the surface of the reticle from FIG. 1 and per the prior art with a reticle assist feature symmetrically centered between two primary features.

Before further detailing various preferred embodiment aspects, some background to certain prior art methodologies for locating SRAFs with respect to primary features is now provided, starting with FIG. 2a. FIG. 2a illustrates a block diagram of a portion of the surface of reticle 20 and that includes portions of chrome layer $20_C$ from FIG. 1, where those chrome portions define a few dark areas that have been formed and, thus, are shown in the perspective of FIG. 2a. As known in the art and in connection with a bright field reticle, the dark areas, such as in FIG. 2a, are referred to as features. Similarly, however, in an opposite approach, a dark field reticle may be formed wherein the open lines are the rectangles in FIG. 2a while the remainder of the reticle is darkened (i.e., covered with chrome), where in this case the open areas are referred to as features. In either event, and for sake of consistency and explanation in this document, each feature on the reticle is further identified herein as either: (i) a reticle primary feature where it is included so as to later cause the formation of a respective circuit feature on a wafer that is exposed to a light in combination with reticle 20; or (ii) a reticle assist feature, intending to include an SRAF, where the reticle assist feature is included proximate one or more reticle primary features and where the reticle assist feature is included so as to later influence the light diffraction and assist or contribute to the formation of the wafer circuit feature that is created due to the reticle primary feature that is proximate the reticle assist feature—further, when the reticle is so used, then ideally no wafer feature corresponding to the reticle assist feature should be printed on the wafer.

Looking specifically to the features in FIG. 2a, it illustrates a reticle primary feature $RPF_1$, a reticle primary feature $RPF_2$, and a reticle assist feature $RAF_1$. Each feature is shown to have a rectangular shape and for sake of reference has a respective major axis, shown by way of a respective dashed line—for purposes of this document, the major axis is an imaginary line that passes down the center of the longer dimension of the rectangular feature. Given the major axes, note that the axis of reticle primary feature $RPF_1$ is parallel to that of reticle primary feature $RPF_2$ and, thus, these two features are parallel to one another. For sake of distinction and necessarily with an accurate scale, the line width LW (i.e., perpendicular to the major axis) for reticle assist feature $RAF_1$ is shown to be less than that of reticle primary features $RPF_1$ and $RPF_2$. Also, while the features are all shown to have the same length, such is not required but is provided for sake of simplifying the present discussion. Still further and for sake of reference and further contrast to the preferred embodiments described later, a primary-to-primary feature space $PPSP_1$ is shown between the closest edges $E_1$ and $E_2$, respectively, of the two reticle primary features. With these introductions, and according to the prior art, where two reticle primary features are to be formed on a reticle such as shown in FIG. 2a, and provided the primary-to-primary feature space $PPSP_1$ between them is in a certain range (e.g., 330 to 430 nm), then a system such as system 10 also locates a reticle assist feature $RAF_1$ centered between the two reticle primary features $RPF_1$ and $RPF_2$. Thus, in FIG. 2a, the primary-to-assist space, shown as $PASP_x$ and defined as the distance from an edge of a reticle primary feature to the closest edge of an adjacent reticle assist feature, is the same with respect to both reticle primary features and reticle assist feature $RAF_1$. In other words, $PASP_1$ and $PASP_2$ are equal to one another, thereby centering reticle assist feature $RAF_1$ between reticle primary features $RPF_1$ and $RPF_2$.

Given the illustrations of FIG. 2a, various observations are now made with respect thereto and for relating later to the preferred embodiments. Reticle primary features are described herein as "primary-type adjacent" relative to one another in that each is a primary type (i.e., as opposed to assist type) and they are situated such that there is not another reticle primary feature between these two reticle primary features. Thus, where two reticle primary features are primary-type adjacent in this manner and where one such reticle primary feature has at least some respective portion that is parallel to the other reticle primary feature, and presuming the reticle primary features are within a certain distance of one another, then the prior art locates an assist feature equidistantly between the two. As a result, when reticle 20 is used to later write an image to a wafer, a first wafer primary feature will be written to the wafer by light passing around reticle primary feature $RPF_1$, a second wafer primary feature will be written to the wafer by light passing around reticle primary feature $RPF_2$, and while no third wafer primary feature will be formed from reticle assist feature $RAF_1$, it will instead influence the light so as to provide better image quality and pattern to enable the printing of the wafer primary features corresponding to reticle primary features $RPF_1$ and $RPF_2$. In this manner, therefore, reticle assist feature $RAF_1$ is also sometimes referred to as "shared" with respect to the reticle primary features, in that the former contributes to the wafer primary features created by the latter.

Figure 2B:
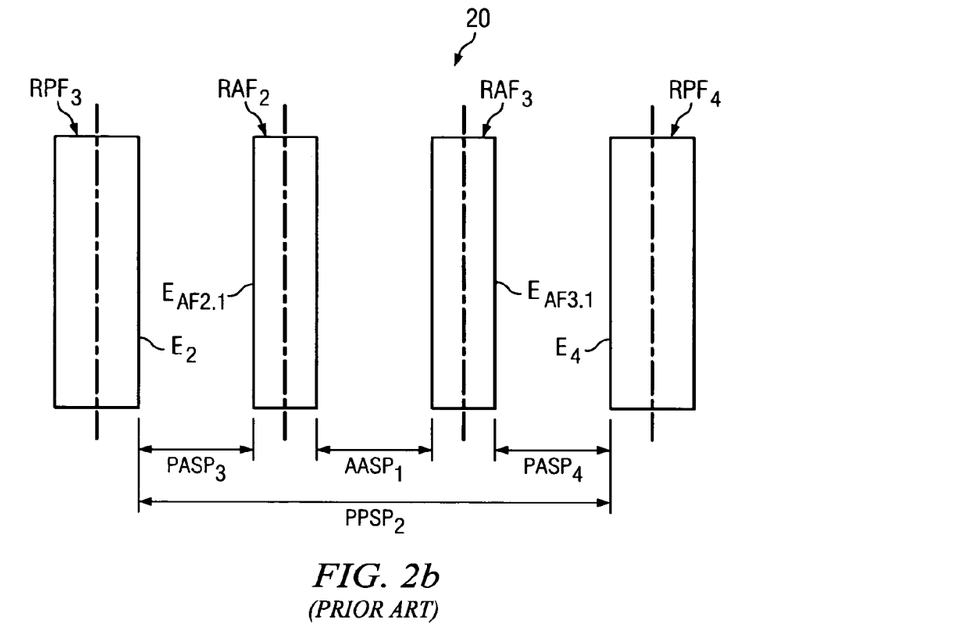
FIG. 2b illustrates a block diagram of a portion of the surface of the reticle from FIG. 1 and per the prior art with two reticle assists features symmetrically centered between two primary features.

FIG. 2b illustrates a block diagram of a different portion of the surface of reticle 20 in a manner comparable to FIG. 2a, but which includes different features so as to illustrate another prior art approach. Particularly, in FIG. 2b, there are shown a reticle primary feature $RPF_3$, a reticle primary feature $RPF_4$, and two reticle assist features $RAF_2$ and $RAF_3$, where all of these features are (or include portions that are) parallel with respect to one another. In FIG. 2b, it is assumed that the primary-to-primary feature space $PPSP_2$ between reticle primary features $RPF_3$ and $RPF_4$ is greater than that (i.e., $PPSP_1$) in FIG. 2a. As a result, and also according to the prior art, a larger number of reticle assist features are located between the reticle primary features. Thus, in the example of FIG. 2b, rather than including one reticle assist feature as was the case in FIG. 2a, then two reticle assist features $RAF_2$ and $RAF_3$ are formed on the reticle surface. Per the prior art, reticle assist features $RAF_2$ and $RAF_3$ are symmetrically located between reticle primary features $RPF_3$ and $RPF_4$ such that the primary-to-assist space $PASP_3$ between adjacent edges $E_3$ and $E_{AF2.1}$, respectively, of reticle primary feature $RPF_3$ and reticle assist feature $RAF_2$, and the primary-to-assist space $PASP_4$ between adjacent edges $E_4$ and $E_{AF3.1}$, respectively, of reticle primary feature $RPF_3$ and reticle assist feature $RAF_3$, are the same distance (i.e., $PASP_3=PASP_4$). The primary-to-assist space $PASP_4$ may vary, but note that regardless of its dimension there is still symmetry with respect to each reticle assist feature relative to its closest reticle primary feature. In this manner, when reticle 20 is used to write the image from FIG. 2b to a wafer, reticle assist feature $RAF_2$ influences the light that will form the wafer primary feature corresponding to reticle primary feature $RPF_3$ in the same way and to the same extent that reticle assist feature $RAF_3$ influences the light that will form the wafer primary feature corresponding to reticle primary feature $RPF_4$.

Figure 2C:
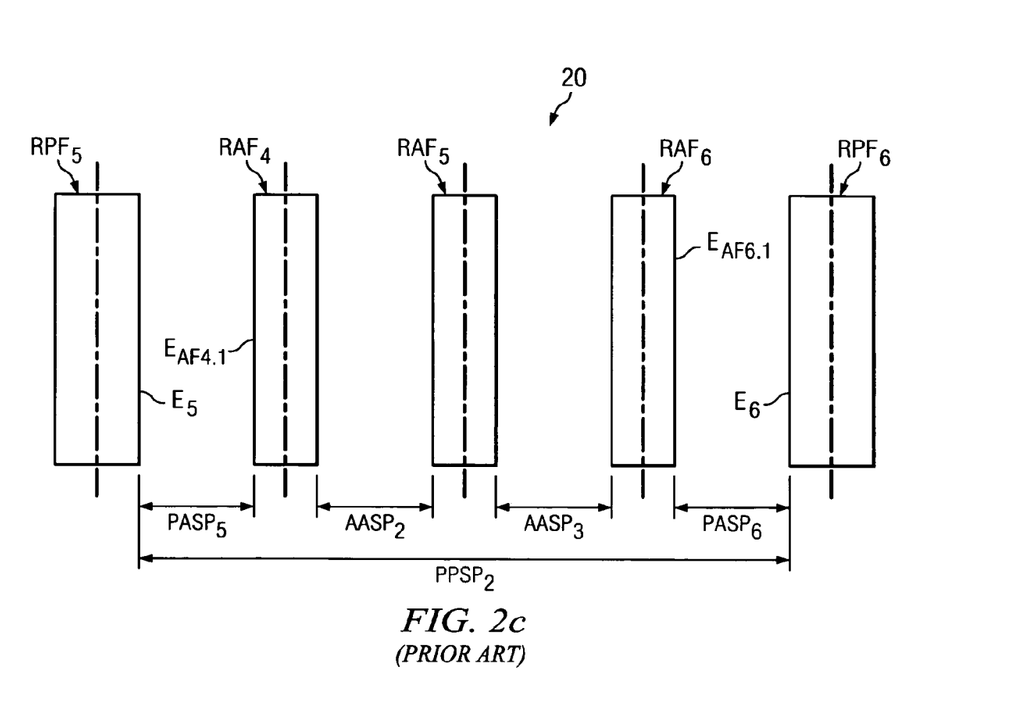
FIG. 2c illustrates a block diagram of a portion of the surface of the reticle from FIG. 1 and per the prior art with three reticle assists features symmetrically centered between two primary features.

FIG. 2c illustrates a prior art block diagram of yet another different portion of the surface of reticle 20 in a manner comparable to FIGS. 2a and 2b, where the space between the reticle mask features is increased farther as compared to FIGS. 2a and 2b. As a result, in FIG. 2c, there are shown a reticle primary feature $RPF_5$, a reticle primary feature $RPF_6$, and three reticle assist features $RAF_4$, $RAF_5$, and $RAF_6$, where all of these features include portions that are parallel with respect to one another. Moreover and also according to the prior art, the number of reticle assist features is increased as compared to the earlier Figures. Further, reticle assist features $RAF_4$, $RAF_5$, and $RAF_6$ are symmetrically located between reticle primary features $RPF_5$ and $RPF_6$ such that the primary-to-assist space $PASP_5$ between adjacent edges $E_s$ and $E_{AF4.1}$, respectively, of reticle primary feature $RPF_5$ and reticle assist feature $RAF_4$, and the primary-to-assist space $PASP_6$ between adjacent edges $E_6$ and $E_{AF6.1}$, respectively, of reticle primary feature $RPF_6$ and reticle assist feature $RAF_6$, are the same distance (i.e., $PASP_5=PASP_6$). Moreover, reticle assist feature $RAF_5$ is centered as between reticle primary features $RPF_5$ and $RPF_6$ (i.e., $AASP_2=AASP_3$). In this manner, when reticle 20 is used to write the image from FIG. 2c to a wafer, reticle assist features $RAF_4$ and $RAF_5$ influence the light that will form the wafer primary feature corresponding to reticle primary feature $RPF_5$ in the same way that reticle assist features $RAF_5$ and $RAF_6$ influence the light that will form the wafer primary feature corresponding to reticle primary feature $RPF_6$.

Additional placements of reticle assist features are known in the art and are not illustrated herein but a few additional aspects are worth mentioning. While FIGS. 2a through 2c show up to three reticle assist features, that number may be increased still further as between two primary-type adjacent reticle features. Thus, the number of reticle assist features may vary and the prior art locates them symmetrically between the primary-type adjacent reticle features. Note also that assist features also may be used with respect to a reticle primary feature that is sufficiently far away from any other primary feature so as to be considered isolated. In this "isolated" case, then reticle assist features are typically placed on both sides and at equidistant distances from the isolated reticle primary feature, again creating a symmetry, but here such that the reticle primary feature is centered with respect to the reticle assist features.

Figure 3:
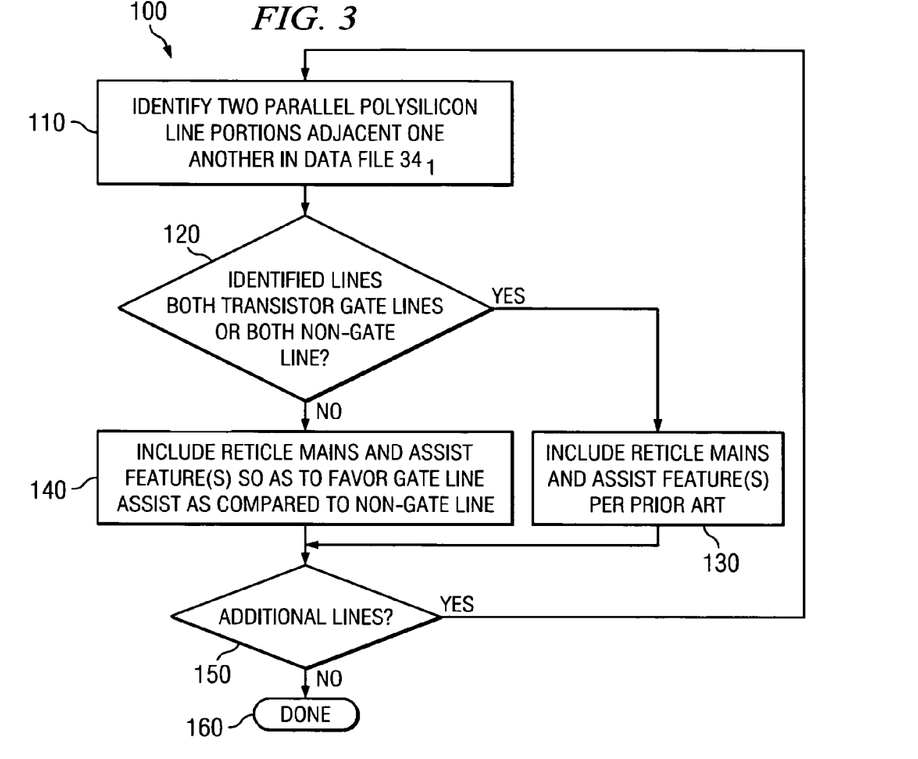
FIG. 3 illustrates a flowchart of a methodology to be implemented in input data file $34_2$ of FIG. 1 and per the preferred embodiment.

FIG. 3 illustrates a flowchart of a methodology 100 to be implemented in input data file $34_2$ of the preferred embodiment as shown in FIG. 1 and its effect when processed by processor system 30 to create output data file $34_3$. While methodology 100 is shown by way of a flowchart, one skilled in the art will appreciate that it may be implemented in various forms and included within system 30, such as by programming code, instructions, rules, parameters, and data in input file $34_2$ and with the appropriate responses and operation by processor system 30. Moreover, various steps may be substituted or re-arranged in the flow or occur concurrently depending on processing power and the like, and the flow also may be illustrated in other forms such as a state machine or still others. In all events, the following steps and illustration therefore are by way of example and do not exhaustively limit the inventive scope.

Methodology 100 begins with a step 110, where in response to file $34_2$ processor system 30 identifies two polysilicon lines having parallel portions adjacent one another in data file $34_1$, where by adjacent it is intended to mean that there is no other polysilicon structure between the two identified parallel line portions. Moreover, and as detailed later, the two identified line portions are preferably within a certain range of distance from one another, and only the identified portions need be parallel, where there may be other portions of one or both of the lines that extend in different directions or that are not parallel. Next, methodology 100 continues from step 110 to step 120.

Step 120 is a conditional step which determines whether each of the two identified portions from step 110 are to ultimately serve as respective transistor gates and the step directs the flow of methodology 100 based on this determination. More specifically, note that the preceding step 110 examined the circuit design layer data in file $34_1$ which likely includes numerous different polysilicon lines; such lines may serve various and different functions in a given circuit. For example, often a polysilicon line will function as a gate to multiple transistors. However, in other instances, a polysilicon line will serve a function other than as a transistor gate. For the sake of this document and a better appreciation of step 120 and methodology 100, then a polysilicon line to function as a transistor gate for one or more transistors is referred to as a transistor gate line and a polysilicon line that does not function as a transistor gate is referred to as a non-gate line. Given these two categories, step 120 directs flow based on whether the two step 110 identified lines are of the same category. Particularly, if both lines are transistor gate lines or if both lines are non-gate lines, then step 120 directs the flow to step 130. However, if one line is a transistor gate line and the other line is a non-gate line, then step 120 directs the flow to step 140. Each of these alternative flow paths is discussed below.

In step 130, having been reached because both identified polysilicon lines are of the same function category defined with respect to step 120, then methodology 100 includes reticle primaries for each of the lines as well as one or more assist features between the reticle primaries per the prior art. Thus, processor system 30 directs appropriate data/instructions to the job deck of output data file $34_3$ so that a reticle primary feature is provided for each of the two identified parallel line portions, and in addition one ore more assist feature(s) will be indicated to be symmetrically located on the reticle between those two reticle primary features. In other words, and by ways of example, any of the configurations shown in FIGS. 2a, 2b, and 2c may be implemented as well as others discussed above or ascertainable by one skilled in the art. Accordingly, if the two step 110 identified line portions are both to function as polysilicon transistor gate lines, then processor system 30 directs data file $34_3$ to locate a reticle primary feature for each of those lines as well as one, two, three or even more assist features to be symmetrically located between those primary features. Similarly, if the two step 110 identified line portions are both to function as non-gate lines, then processor system 30 directs data file $34_3$ to locate a reticle primary feature for each of those lines as well as one, two, three or even more assist features to be symmetrically located between those primary features. After step 130 methodology 100 continues to a step 150, which operates such that if there are additional lines in input file $34_1$ that have not been processed, flow returns to step 110 to identify two of those lines; alternatively, if no such additional lines exist, then the flow continues to a final step indicated at 160 which simply represents the completion of this methodology, although certainly other steps with respect to the formation of output data file $34_3$ may be added hereto.

Figure 4:
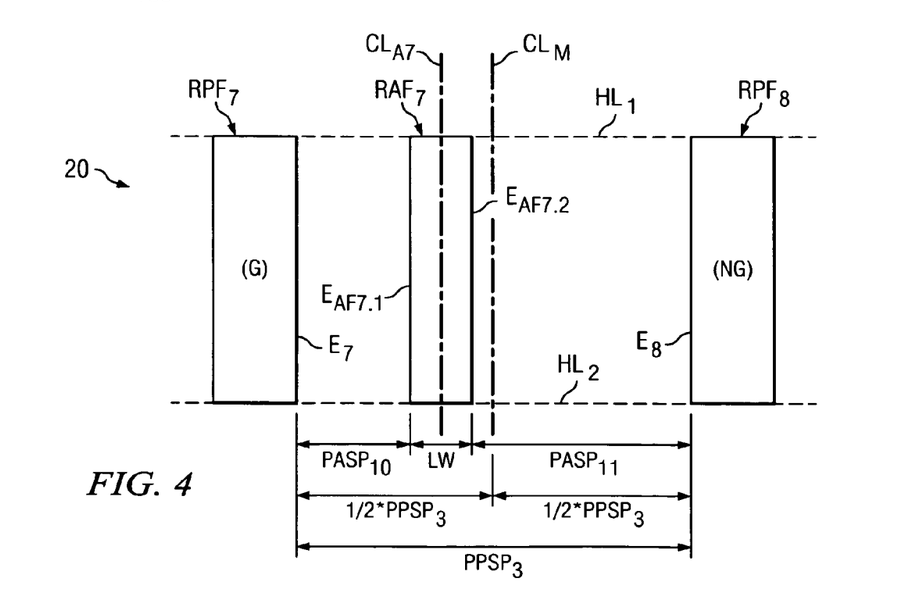
FIG. 4 illustrates a block diagram of a portion of the surface of the reticle from FIG. 1 and per the preferred embodiments with a reticle assist feature asymmetrically centered between two primary features.

In step 140, having been reached because one of the step 110 identified polysilicon lines is to function as a transistor gate line while the other is a non-gate line and, thus, to serve a different function, then methodology 100 includes reticle primaries for each of those lines as well as one or more assist features between the two identified lines per a novel approach; in this novel approach, the assist features are sized and located relative to the reticle primaries so that a greater amount of assist area favors the reticle primary corresponding to the transistor gate line as compared to the reticle main corresponding to the non-gate line, as is detailed later and is also now further described immediately below in connection with FIG. 4.

FIG. 4 illustrates a block diagram of a portion of the surface of reticle 20 in a manner comparable to FIGS. 2a through 2c, but now as directed to the preferred embodiments. FIG. 4 illustrates a reticle primary feature $RPF_7$, a reticle primary feature $RPF_8$, and a reticle assist feature $RAF_7$, where all of these features include portions that are parallel with respect to one another and as shown aligned by imaginary horizontal lines $HL_1$ and $HL_2$. A primary-to-primary feature space $PPSP_3$ exists between reticle primary features $RPF_7$ and $RPF_8$, and for sake of illustrating a preferred aspect, note that an imaginary center line $CL_M$ is shown parallel to primary features $RPF_7$ and $RPF_8$ and halfway between those primary features (i.e., as shown by the dimension $½*PPSP_3$ as between each primary feature inner edge $E_7$ and $E_8$ and center line $CL_M$). Per the preferred embodiments, note now that reticle assist feature $RAF_7$ is asymmetrically located between reticle primary features $RPF_7$ and $RPF_8$, that is, the primary-to-assist space $PASP_{10}$ between inner edge $E_7$ of feature $RPF_7$ and an adjacent edge $E_{AF7.1}$ of reticle assist feature $RAF_7$ is not equal to the primary-to-assist space $PASP_{11}$ between the inner edge $E_8$ of reticle primary feature $RPF_8$ and an adjacent edge $E_{AF7.2}$ of reticle assist feature $RAF_7$. Particularly, in the illustrated example $PASP_{10}$ is less than $PASP_{11}$ such that with respect to the area of reticle assist feature $RAF_7$, as located between imaginary horizontal lines $HL_1$ and $HL_2$, its center line $CL_{A7}$ is closer to reticle primary feature $RPF_7$ as compared to reticle primary feature $RPF_8$. In other words and as further explored below, the area of reticle assist feature $RAF_7$ for purposes of providing assist favors reticle main feature $RPF_7$ as compared to reticle primary feature $RPF_8$.

Looking now to FIGS. 3 and 4 in combination, note further that in FIG. 4 it is intended that reticle primary feature $RPF_7$ corresponds to (i.e., will provide a wafer feature for) a transistor gate line while reticle primary feature RPF$_8$ corresponds to a non-gate line as shown by the respective indications in FIG. 4 of "(G)" and "(NG)". Thus, when method 100 reaches step 120, the flow is directed to step 140. Recall that step 140 locates reticle primaries for each of the lines, which are shown in FIG. 4 as reticle primary features RPF$_7$ and RPF$_8$. Additionally, however, step 140 locates one or more assist features between the two reticle primaries, where the assist feature (or features) is sized and located relative to the reticle primaries so that a greater amount of assist area favors the reticle primary corresponding to the transistor gate line as compared to the reticle primary corresponding to the non-gate line. Accordingly, in FIG. 4, step 140 has located reticle assist feature RAF$_7$ in an asymmetric manner relative to the reticle primary features RPF$_7$ and RPF$_8$, whereby the area of reticle assist feature RAF$_7$ is located nearer to reticle primary feature RPF$_7$ (which will cause the formation of a transistor gate line) as compared to reticle primary feature RPF$_8$ (which will cause the formation of a non-gate line). In the example of FIG. 4, this result may be easily appreciated by noting that reticle assist feature RAF$_7$ is shifted toward the left relative to center line CL$_M$. As a result, when reticle 20 is later used to form wafer features, reticle assist feature RAF$_7$ will have a greater impact (i.e., provide a greater assist) to the wafer primary feature corresponding to reticle primary feature RPF$_7$ as compared to the impact provided to the wafer primary feature corresponding to reticle primary feature RPF$_8$. Accordingly, one skilled in the art should appreciate that the step 120 distinction between the function of line types ultimately results in the favoring of feature assist to transistor gate lines as opposed to non-gate lines. As a result, when wafer features are later formed using a reticle per the preferred embodiment, the benefits of sub-resolution feature assist are applied to a larger extent to the gate structures and thereby improve the formation of such devices.

Note also that step 140 may be achieved in a comparable manner to step 130, with sufficient adjustments such as by changing parameters to software code or the like. Thus, processor system 30 is configured to direct appropriate data/instructions to the job deck of output data file 34$_3$ so that a reticle primary feature is provided for each of the two identified parallel line portions, and in addition an assist feature(s) will be indicated to be located on the reticle between those two reticle primary features so as to favor the later formation of the transistor gate line. In other words, and by way of example, the configuration shown in FIG. 4 may be implemented as well as others discussed below and still others that are ascertainable by one skilled in the art. Accordingly, if one of the two step 110 identified line portions is a transistor gate line while the other is a non-gate line, then processor system 30 directs data file 34$_3$ to locate a reticle primary feature for each of those lines as well as one (or more) assist features to be asymmetrically located between those lines, having an overall area that favors the reticle primary feature that corresponds to a transistor gate line. After step 140, methodology 100 continues to a step 150, which as described above operates to determine if there are additional lines (or line portions) in input file 34$_1$ that have not been processed; if so, the flow returns to step 110 to identify two of those lines (or line portions) and, alternatively, if no such additional lines (or line portions) exist, then the flow continues to the final step indicated at 160.

Looking now at additional details with respect to step 140, recall that it is stated above that it locates one or more assist features between the primary features for the two step 110 identified line portions. In the preferred embodiment, three parameters in this regard are determined by step 140 and under the control of file 34$_2$ in FIG. 1 in response to the primary-to-primary feature distance, namely: (i) the number of located assist features; (ii) the positioning of each assist feature; and (iii) the line width of those assist features. Thus, in the case of FIG. 4, the choice of one reticle assist feature RAF$_7$, its location relative to reticle primary features RPF$_7$ and RPF$_8$, and its line width, shown in FIG. 4 as LW, are all based in response to primary-to-primary feature distance PPSP$_3$. Per the preferred embodiment, examples of these three parameters are summarized in the following Table 1 in the case of a single reticle assist feature RAF, although these numbers may be adjusted by one skilled in the art based on various additional considerations.

TABLE 1

| Rule | PPSP (nm) | Number RAFs | LW (nm) | PASP |
|---|---|---|---|---|
| 1 | 330 ≦ PPSP < 390 | 1 | 30 | 150 |
| 2 | 390 ≦ PPSP < 430 | 1 | 40 | 155 |
| 3 | 430 ≦ PPSP < 470 | 1 | 46 | 152 |
| 4 | 470 ≦ PPSP < 530 | 1 | 46 | 152 |

Per Table 1, therefore, a Rule 1 is defined that is applied by step 140 if the primary-to-primary feature space PPSP is greater than or equal to 330 nm and less than 390 nm; in this case, step 140 includes a single reticle assist feature and locates it between those primary-adjacent features, where its width (LW) is 30 nm and the distance between its edge adjacent to an adjacent edge of the reticle primary feature is 150 nm. Thus, applying these numbers by way of example to FIG. 4, if 330≦PPSP$_3$<390, then PASP$_{10}$ is equal to 150 nm and LW is equal to 30 nm. As another example, if for FIG. 4 it is the case that 390≦PPSP$_3$<430, then step 140 applies Rule 2 from Table 1 and, thus, PASP$_{10}$ is equal to 155 nm and LW is equal to 40 nm. Accordingly, for this latter Rule, the spacing between the favored reticle primary feature (corresponding to the gate line) and the assist feature is adjusted, while at the same time the line width LW of the assist feature is increased; of course, since PPSP also increases for Rule 2, then the distance between the assist feature and the un-favored primary feature (corresponding to the non-gate line) increases as compared to the distance between the assist feature and the favored primary feature. The remaining Rules 3 and 4 from Table 1 will be appreciated from one skilled in the art.

Figure 5:
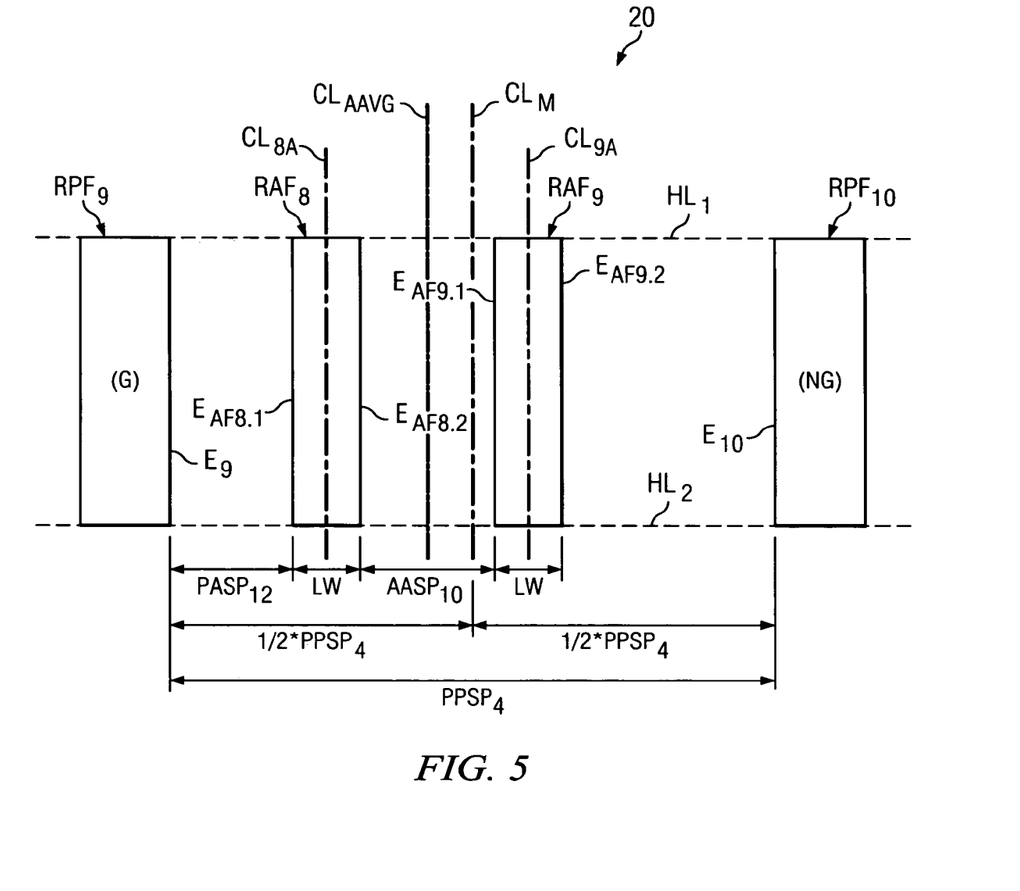
FIG. 5 illustrates a block diagram of a portion of the surface of the reticle from FIG. 1 and per the preferred embodiments with two reticle assist features asymmetrically centered between two primary features.

As introduced above, one of the parameters adjusted by step 140 is the number of located assist features. FIG. 4 and Rules 1 through 4 of Table 1 illustrate examples of the location of a single assist feature. However, the preferred embodiments contemplate the use of more than one assist feature. By way of example, FIG. 5 illustrates an example for preferred embodiment cases that use two assist features, again with assist that overall favors the primary feature that corresponds to a transistor gate line. Looking then to FIG. 5, it illustrates a reticle primary feature RPF$_9$, a reticle primary feature RPF$_{10}$, and two reticle assist features RAF$_8$ and RAF$_9$, where again for sake of simplifying the example all features include portions that are parallel with respect to one another. Assume in the example of FIG. 5 that reticle primary feature RPF$_9$ is for forming a corresponding transistor gate line and reticle primary feature RPF$_{10}$ is for forming a corresponding non-gate line. A primary-to-primary feature space PPSP$_4$ exists between reticle primary features RPF$_9$ and RPF$_{10}$, and an imaginary center line CL$_M$ is shown parallel to and halfway between them. Per the preferred embodiments, note again that reticle assist features RAF$_8$ and RAF$_9$ are asymmetrically located between reticle primary features RPF$_9$ and RPF$_{10}$, where here this is discernable in that each assist feature is a different distance from primary feature center line CL$_M$, but note now that the assist features are examined collectively to demonstrate that cumulatively their area between imaginary lines HL$_1$ and HL$_2$ favors reticle primary feature RPF$_9$ as compared to the reticle primary feature RPF$_{10}$, since the former corresponds to a transistor gate line function and the latter does not. Specifically, in the example of FIG. 5, note that center line CL$_{8A}$ of assist feature RAF$_8$ is closer to primary feature RPF$_9$ as compared to primary feature RPF$_{10}$ as was the case in FIG. 4 with respect to center line CLA$_7$ of assist feature RAF$_7$. However, with respect to assist feature RAF$_9$ in FIG. 5, its center line CLA$_9$ is closer to primary feature RPF$_{10}$ as compared to primary feature RPF$_9$. To demonstrate the cumulative effect of the assist features in FIG. 5, however, also shown is the assist center line average CL$_{AAVG}$, which represents a positional average for center lines CL$_{8A}$ and CL$_{9A}$; since there are two assist features CL$_{8A}$ and CL$_{9A}$, then the position of center line average CL$_{AAVG}$ is centered between those two features, although as shown later a positional average can be taken for more than two positions of respective assist features and that is also consistent with the same result of the preferred embodiments. With the resulting center line average CL$_{AAVG}$ of the assist features, it is shown that such an average falls closer to primary feature RPF$_9$ as compared to primary feature RPF$_{10}$, which is easily discernable in FIG. 5 because assist center line average CL$_{AAVG}$ is to the left of primary feature center line CL$_M$. With this result, note then that when reticle 20 of FIG. 5 is used to form lines on a wafer, cumulatively assist features RAF$_8$ and RAF$_9$ will have a greater assist impact on the transistor gate line corresponding to and formed by primary feature RPF$_9$ as compared to the impact they will have on the non-gate line corresponding to and formed by primary feature RPF$_{10}$.

Having demonstrated with FIG. 5 an implementation of the preferred embodiment using two assist features, Table 1 is now expanded into the form of Table 2, below, which includes additional preferred dimensions for instances where step 140 locates two assist features:

TABLE 2

| Rule | PPSP (nm) | Number RAFs | LW (nm) | PASP |
|---|---|---|---|---|
| 1 | 330 ≦ PPSP < 390 | 1 | 30 | 150 |
| 2 | 390 ≦ PPSP < 430 | 1 | 40 | 155 |
| 3 | 430 ≦ PPSP < 470 | 1 | 46 | 152 |
| 4 | 470 ≦ PPSP < 530 | 1 | 46 | 152 |
| 5 | 530 ≦ PPSP < 710 | 2 | 46 | 152 (PASP$_{12}$; closer) 120 (AASP$_{10}$; farther) |

Per Table 2, therefore, a new Rule 5 is defined where the primary-to-primary feature space PPSP is greater than or equal to 530 nm and less than 710 nm. In this case, step 140 includes two primary-adjacent features and two reticle assist features located between those primary-adjacent features, where the line width (LW) of each assist feature is 46 nm. With respect to the distance of each assist feature from the reticle primary feature that corresponds to a transistor gate, those distances are shown in Table 2 with the labels used in FIG. 5, namely, PASP$_{12}$ and AASP$_{10}$. This usage is intended to suggest that the distance between the assist feature RAF$_8$ that is closer to the gate-corresponding reticle primary feature RPF$_9$ and having an edge E$_{AF8.1}$ adjacent to that feature is 152 nm, and the distance between the opposite first assist feature edge, E$_{AF8.2}$, and the adjacent edge E$_{AF9.1}$ of the second farther assist feature is 120 nm. Indeed, given Rule 5, assume for the sake of an example that in FIG. 5, PPSP$_4$=530 nm in which case its midpoint or center-line CL$_M$ is at 265 nm between reticle primary features RPF$_9$ and RPF$_{10}$. In this case, then one skilled in the art may confirm that applying step 140 to Rule 5 of Table 2 results in center line CL$_{8A}$ at 174.5 nm from edge E$_9$ and center line CL$_{9A}$ at 339.5 nm from edge: E$_9$; thus, as shown in FIG. 5, center line CL$_{8A}$ is to the left of primary feature center line CL$_M$, while center line CL$_{9A}$ is to the right of primary feature center line CL$_M$. However, the positional average CL$_{AAVG}$ of assist features RPF$_9$ and RPF$_{10}$ is therefore 257 nm (i.e., (174.5+339.5)/2=257 nm) from edge E$_9$ and, thus, it is to the left of primary feature center line CL$_M$ (at 265 nm) and closer to reticle primary feature RFM$_9$ than it is to reticle primary feature RFM$_{10}$. With this result, the net effect once more is that the cumulative area of assist features RAF$_9$ and RAF$_{10}$ favors reticle primary feature RPF$_9$ as compared to the reticle primary feature RPF$_{10}$, again where the former corresponds to a transistor gate line and the latter does not.

Having demonstrated implementations of the preferred embodiments using one or two assist features, Table 2 is now expanded into the form of Table 3, below, which includes additional preferred dimensions for instances where step 140 locates three assist features:

TABLE 3

| Rule | PPSP (nm) | Number RAFs | LW (nm) | PASP |
|---|---|---|---|---|
| 1 | 330 ≦ PPSP < 390 | 1 | 30 | 150 |
| 2 | 390 ≦ PPSP < 430 | 1 | 40 | 155 |
| 3 | 430 ≦ PPSP < 470 | 1 | 46 | 152 |
| 4 | 470 ≦ PPSP < 530 | 1 | 46 | 152 |
| 5 | 530 ≦ PPSP < 710 | 2 | 46 | 152 (PASP$_{12}$; closer) 120 (AASP$_{10}$; farther) |
| 6 | 710 ≦ PPSP < 870 | 3 | 46 | 152 (PASP$_{14}$; closer) 120 (AASP$_{11}$; farther) 152 (PASP$_{15}$; farthest) |

Figure 6:
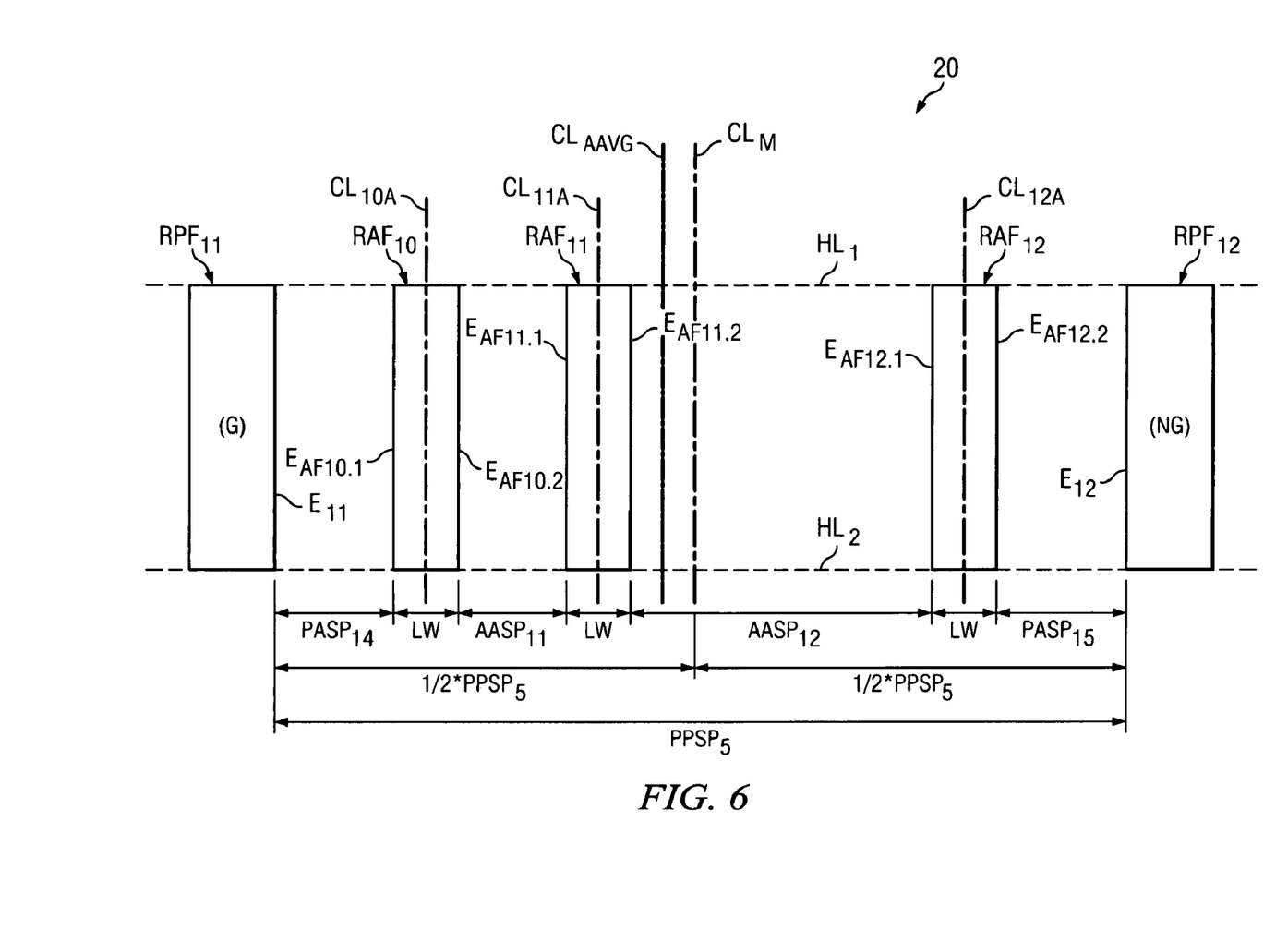
FIG. 6 illustrates a block diagram of a portion of the surface of the reticle from FIG. 1 and per the preferred embodiments with three reticle assist features asymmetrically centered between two primary features, where the two outer assist features alone are the same distance from adjacent respective primary features.

To further illustrate the addition to Table 3 versus Table 2, FIG. 6 illustrates that the preferred embodiments may be extended still further by including three assist features, while still achieving a cumulative assist area that favors the reticle primary feature that corresponds to a gate transistor line as compared to the reticle primary feature that corresponds to a non-gate line. In the illustration, FIG. 6 depicts a reticle primary feature RPF$_{11}$ that is intended to correspond to a transistor gate line and a reticle primary feature RPF$_{12}$ that is intended to correspond to a non-gate line, with a primary-to-primary feature space PPSP$_5$ between them and a center line CL$_M$ halfway along that space. Between primary features RPF$_{10}$ and RPF$_{11}$ are three reticle assist features RAF$_{10}$, RAF$_{11}$, and RAF$_{12}$, asymmetrically located between reticle primary features RPF$_{10}$ and RPF$_{11}$. Assume for the sake of example that PPSP$_5$=860 nm; in this case, note that Table 2 includes a Rule 6 that applies due to the distance of PPSP$_5$=860 nm, and Rule 6 calls for three assist features, where with respect to the first two $PASP_{14}=152$ nm and $AASP_{11}=120$ nm. However, per the preferred embodiment an additional assist feature $RAF_{12}$ is added, with $PASP_{15}=152$ nm, that is, this latter assist feature is as close to edge $E_{12}$ of primary feature $RPF_{12}$ as is assist feature $RAF_{10}$ to edge $E_{11}$ of primary feature $RPF_{11}$. Thus, there is symmetry of the outer assist features $RAF_{10}$ and $RAF_{12}$ as between the space $PPSP_5$ between primary features $RPF_{11}$ and $RPF_{12}$, but collectively when including the third assist feature $RAF_{11}$ with assist features $RAF_{10}$ and $RAF_{12}$ the symmetry no longer exists. Specifically and given the preceding, one skilled in the art may determine that the center line $CL_{10A}$ for assist feature $RAF_{10}$ is at position 174.5 nm relative to edge $E_{11}$ of primary feature $RPF_{11}$, the center line $CL_{11A}$ for assist feature $RAF_{11}$ is at position 339.5 nm relative to edge $E_{11}$ of primary feature $RPF_{11}$ and the center line $CL_{12A}$ for assist feature $RAF_{12}$ is at position 685.5 nm relative to edge $E_{11}$ of primary feature $RPF_{11}$. The average of these three positions is 399.8 (i.e., {174.5+339.5+685.5}/3), as shown by assist center line average $CL_{AAVG}$ in FIG. 6. Note that such a location is to the left of main center line $CL_M$, which is at position 430 nm because it is at the halfway point of $PPSP_5=860$ nm. Thus, even though assist feature $RAF_{12}$ is as close to primary feature $RPF_{12}$ as assist feature $RAF_{10}$ is to primary feature $RPF_{11}$, the cumulative assist by all three assist features, when also factoring in the effect of assist feature $RAF_{11}$ which has a center line $CL_{11A}$ to the left of main center line $CL_M$, is to favor a greater amount of assist to the reticle primary feature for the transistor gate line (i.e., $RPF_{11}$) as compared to the reticle primary feature for the non-gate line (i.e., $RPF_{12}$).

Still other alternative preferred embodiments may be provided by variations to the example of Rules in the preceding Tables and by adding still additional assist features; to illustrate an example of such an alteration, Rule 6 from Table 3 may be modified as is now shown in the following Table 4, which includes the same first five Rules but substitutes an alternative Rule 6' in place of Rule 6 from Table 3.

TABLE 4

| Rule | PPSP (nm) | Number RAFs | LW (nm) | PASP |
|---|---|---|---|---|
| 1 | 330 ≤ PPSP < 390 | 1 | 30 | 150 |
| 2 | 390 ≤ PPSP < 430 | 1 | 40 | 155 |
| 3 | 430 ≤ PPSP < 470 | 1 | 46 | 152 |
| 4 | 470 ≤ PPSP < 530 | 1 | 46 | 152 |
| 5 | 530 ≤ PPSP < 710 | 2 | 46 | 152 ($PASP_{12}$; closer) 120 ($AASP10$; farther) |
| 6 | 710 ≤ PPSP < 870 | 3 | 46 | 152 ($PASP_{14}$; closer) 120 ($AASP_{11}$; farther) 120 ($AASP_{13}$; farthest) |

Figure 7:
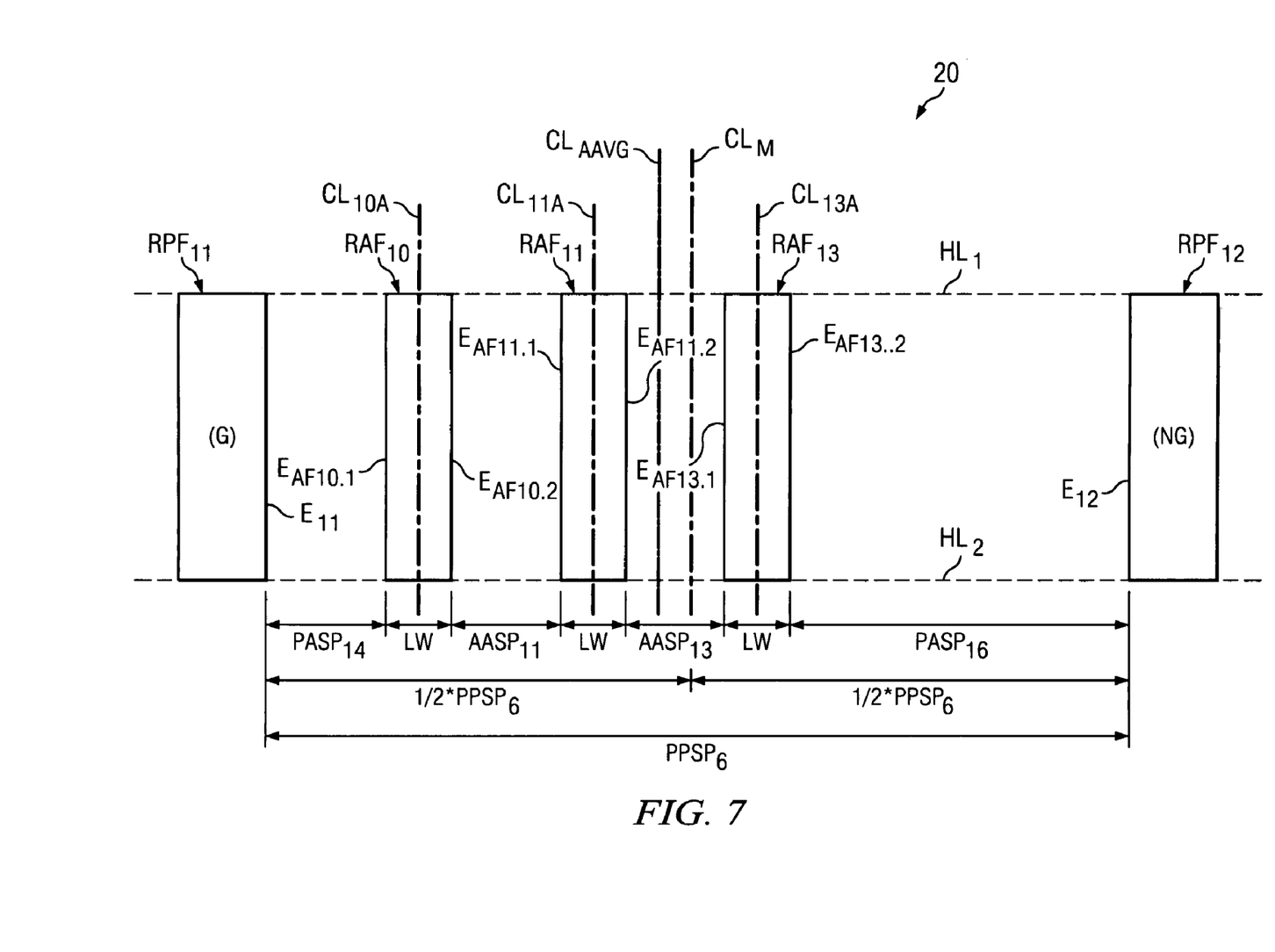
FIG. 7 illustrates a block diagram of a portion of the surface of the reticle from FIG. 1 and per the preferred embodiments with three reticle assist features asymmetrically centered between two primary features.

To further illustrate the Rule 6' in Table 4, FIG. 7 illustrates again from FIG. 6 the two reticle primary features $RPF_{11}$ and $RPF_{12}$, as well as the preferred assist features $RAF_{10}$ and $RAF_{11}$ all with the same positions and dimensions set forth above. Thus, assist features $RAF_{10}$ and $RAF_{11}$ are 46 nm wide, $PPSP_6$ is the same distance as $PPSP_5$ in FIG. 5 (e.g., 860 nm), and the values of $PASP_{14}$ and $AASP_{11}$ are unchanged. However, consistent with Rule 6' from Table 4 as is now explored, a different assist feature $RAF_{13}$ is also illustrated in lieu of assist feature $RAF_{12}$ shown in FIG. 6, and the following demonstrates that this change imports additional asymmetry into the assist feature configuration and this configuration also will favor greater assistance to the gate reticle primary feature $RPF_{11}$ as compared to the non-gate reticle primary feature $RPF_{12}$. Looking to Table 4, the distance of $PPSP_6=860$ nm corresponds to Rule 6', which calls for the third assist feature, $RAF_{13}$, with $AASP_{13}=120$ nm. In other words, with respect to Rule 6', it describes the distance to the assist feature that is farthest from the gate primary feature $RPF_{11}$ based on a measurement from an adjacent edge of the second farthest reticle feature, where this dimension is shown by $AASP_{13}$ in FIG. 7 as between the edge $EAF_{11.2}$ of the second farthest assist feature $RAF_{11}$ and the edge $EAF_{13.1}$ of the farthest assist feature $RAF_{13}$. Thus, there is no symmetry of the assist features $RAF_{10}$, $RAF_{11}$, and $RAF_{13}$ as between the space $PPSP_6$ between primary features $RPF_{11}$ and $RPF_{12}$. As demonstrated above from FIG. 6, the center line $CL_{10A}$ for assist feature $RAF_{10}$ is at position 174.5 nm relative to edge $E_{11}$ of primary feature $RPF_{11}$, the center line $CL_{11A}$ for assist feature $RAF_{11}$ is at position 339.5 nm relative to edge $E_{11}$ of primary feature $RPF_{11}$, and one skilled in the art may readily confirm now that in FIG. 7 the center line $CL_{13A}$ for assist feature $RAF_{13}$ is at position 507.0 nm relative to edge $E_{11}$ of primary feature $RPF_{11}$. The average of these three positions is 340.3 (i.e., {174.5+339.5+507.0}/3), as shown by assist center line average $CL_{AAVG}$ in FIG. 7. Note that such a location is to the left of main center line $CL_M$, which is at position 430 nm because it is at the halfway point of $PPSP_5=860$ nm. Note further that assist center line average $CL_{AAVG}$ in FIG. 7 is shifted farther to the left as compared to assist center line average $CL_{AAVG}$ in FIG. 6, where the shift is a result of the fact that assist feature $RAF_{13}$ of FIG. 7 is farther to the left as compared to assist feature $RAF_{12}$ of FIG. 6. Thus, the cumulative assist by all three assist features in FIG. 7 is to favor a greater amount of assist to the reticle primary feature for the transistor gate line (i.e., $RPF_{11}$) as compared to the reticle primary feature for the non-gate line (i.e., $RPF_{12}$).

From the above, it may be appreciated that the preferred embodiments provide a method and apparatus for locating assist features on a reticle or mask for use in forming semiconductor circuits, where such features may be from either bright field or dark field reticles and such reticles may or may not use phase shifting and include other variants such as chromeless phase lithography. Various alternatives have been provided according to preferred embodiments, and still others may be ascertained by one skilled in the art. In all events, the preferred embodiments have been shown to provide one or more assist features between two adjacent primary features on a reticle, and when one primary feature corresponds to a line to serve one function (e.g., to form a transistor gate line) while the other primary feature corresponds to a line for a less critical function. In this case of different functions, the preferred embodiments size and/or locate the assist features so that a greater amount of assist is provided to the primary feature corresponding to one function (e.g., the transistor gate line) as compared to the primary feature corresponding to the other function (e.g., the non-gate line). Increasing the assist in this relative manner may be achieved in various ways per the preferred embodiments, as has been demonstrated in part herein by examples. For example, one approach locates a single assist feature between the primary features but positions the assist feature closer to the primary feature corresponding to the transistor gate line as opposed to the other primary feature. As another example, another approach locates two or more assist features between the primary features but positions the features so that a positional average of the assist features is closer to the primary feature corresponding to the transistor gate line as opposed to the other primary feature. As still another approach, a possible variation is to use a first assist feature with a first width and located with a center line at a given distance to a primary feature corresponding to the transistor gate line and a second assist feature with a second width, less than the first width, and located with a center line at the same given distance to a primary feature corresponding to the transistor non-gate line; in this case, the wider assist feature provides a greater assist to its adjacent primary feature as compared to the assist provided by the narrower assist feature to its adjacent primary feature. This approach, however, may not be as effective for at least two reasons. First, assist feature location plays a more important role than assist feature width since location is more effective in modulating light diffraction. Second, in the above-illustrated approaches based on assist feature location, in the preferred embodiments the largest possible width already has been provided for such features as an optimization that balances the goal to provide assist while at the same time not allowing the assist feature to become too wide, where any additional width beyond the optimization runs the risk of causing the assist to cause a separate printing on the wafer. Still other examples may be permitted within the inventive scope and may be ascertained by one skilled in the art. Given the preceding, therefore, one skilled in the art should further appreciate that while the present embodiments have been described in detail, various substitutions, modifications or alterations could be made to the descriptions set forth above without departing from the inventive scope, as is defined by the following claims.

The invention claimed is:

1. A method of operating a computing system to determine reticle data, the reticle data for completing a reticle for use in projecting an image to a semiconductor wafer, the method comprising:
   receiving circuit design layer data comprising a desired circuit layer layout, the layout comprising a plurality of lines;
   identifying in the plurality of lines a first line portion for use as a first circuit function and a second line portion for use as a second circuit function that differs from the first circuit function, the first line portion being parallel and adjacent to the second line portion; and
   generating the reticle data in an output data file for use in forming features on the reticle, the generating step comprising:
      indicating a location on the reticle where a first primary feature is to be formed, the first primary feature corresponding to the first line portion;
      indicating a location on the reticle where a second primary feature is to be formed, the second primary feature corresponding to the second line portion; and
      indicating parameters for forming at least one assist feature on the reticle comprising indicating an asymmetric location of the at least one assist feature on the reticle between the first primary feature and the second primary feature, wherein in use of the reticle for use-in projecting the image to the semiconductor wafer, positioning of the at least one assist feature favors the first primary feature as compared to the second primary feature.

2. The method of claim 1 wherein the first line portion is for use as at least one transistor gate and the second line portion is for use other than as a transistor gate.

3. The method of claim 2 wherein the step of indicating parameters for forming a least one assist feature on the retiele comprises indicating parameters for forming at least one, two, or three assist features between the first primary feature and the second primary feature.

4. The method of claim 2 wherein indicating an asymmetric location comprises indicating a location of a single assist feature between the first primary feature and the second primary feature and to have a major axis that is closer to a major axis of the first primary feature than to a major axis of the second primary feature.

5. The method of claim 2 wherein indicating an asymmetric location comprises indicating a respective location for each assist feature in a plurality of assist features between the first primary feature and the second primary feature, wherein a positional average taken from a major axis for each assist feature in the plurality of assist features is closer to a major axis of the first primary feature than to a major axis of the second primary feature.

6. The method of claim 2 wherein the step of indicating parameters for forming at least one assist feature on the reticle comprises:
   indicating parameters for forming at least two assist features on the reticle between the first primary feature and the second primary feature; and
   indicating parameters for forming a first of the at least two assist features to have a first width and for forming a second of the at least two assist features to have a second width differing from the first width.

7. The method of claim 2 wherein the step of indicating parameters for forming at least one assist feature on the reticle comprises:
   indicating parameters for forming a plurality of assist features on the reticle between the first primary feature and the second primary feature; and
   indicating parameters for forming at least one assist feature of the plurality of assist features to have a width that differs from at least one other assist feature of the plurality of assist features.

8. The method of claim 2 wherein the first line and the second line comprise polysilicon lines or metal lines.

9. The method of claim 2:
   wherein the at least one assist feature comprises a plurality of assist features; and
   wherein a cumulative area of the plurality of assist features between the first primary feature and the second primary feature will, when the reticle is used in projecting the image, have a greater assist feature impact on a wafer feature corresponding to the first line portion as compared to a wafer feature corresponding to the second line portion.

10. The method of claim 2 wherein the step of indicating parameters for forming at least one assist feature is responsive to a distance between the first primary feature and the second primary feature.

11. The method of claim 2 wherein the step of indicating parameters for forming at least one assist feature on the reticle further comprises indicating parameters for positioning the at least one assist feature on the reticle in response to a distance between the first primary feature and the second primary feature.

12. The method of claim 2 wherein the step of indicting parameters for forming at least one assist feature on the reticle comprises indicating parameters for forming a first assist feature and a second assist feature.

13. The method of claim 12 wherein the step of indicating parameters for forming a first assist feature and a second assist feature comprises indicating an asymmetric location of the first and second assist features on the reticle relative to the first primary feature and the second primary feature.

14. The method of claim 12 wherein the step of indicating parameters for forming a first assist feature and a second assist feature comprises indicating parameters for forming the first assist feature to have a first width and for forming the second assist feature to have a second width differing from the first width.

15. The method of claim 14 wherein the step of indicating parameters for forming a first assist feature and a second assist feature comprises indicating a symmetric location of the first and second assist features on the reticle relative to the first primary feature and the second primary feature such that the asymmetric location is defined by a predominant width of either the first or second assist feature.

16. The method of claim 2 wherein the step of indicating parameters for forming at least one assist feature on the reticle comprises indicating parameters for forming a first assist feature and a second assist feature and a third assist feature.

17. The method of claim 16 wherein the step of indicating parameters for forming first assist feature and a second assist feature comprises indicating an asymmetric location of the first and third assist feature on the reticle relative to the first primary feature and the second primary feature and a location of the second assist feature between the first and third assist features.

18. The method of claim 16 wherein the step of indicating parameters for forming a first assist feature and a second assist feature and a third assist feature comprises indicating a symmetric location of the first and third assist features on the reticle relative to the first primary feature and the second primary feature and an asymmetric location of the second assist feature between the first and third assist features.

19. The method of claim 1 wherein indicating an asymmetric location comprises indicating a location of a single assist feature between the first primary feature and the second primary feature and to have a major axis that is closer to a major axis of the first primary feature than to a major axis of the second primary feature.

20. The method of claim 1 wherein indicating an asymmetric location comprises indicating a respective location for each assist feature in a plurality of assist features between the first primary feature and the second primary feature, wherein a positional average taken from a major axis for each assist feature in the plurality of assist features is closer to a major axis of the first primary feature than to a major axis of the second primary feature.

21. The method of claim 1 wherein the step of indicating parameters for forming at least one assist feature on the reticle comprises:
   indicating parameters for forming a plurality of assist features on the reticle between the first primary feature and the second primary feature; and
   indicating parameters for forming at least one assist feature of the plurality of assist features to have a width that differs from at least one other assist feature of the plurality of features.

22. The method of claim 1 wherein the step of indicating parameters for forming at least one assist feature is responsive to a distance between the first primary feature and the second primary feature.

23. The method of claim 1:
   wherein the step of indicating parameters for forming at least one assist feature on the reticle comprises indicating parameters for forming a first assist feature and a second assist feature; and
   wherein the step of indicating parameters for forming a first assist feature and a second assist features comprises indicating an asymmetric location of the first and second assist features on the reticle relative to the first primary feature and the second primary feature.

24. The method of claim 1 wherein the step of indicating parameters for forming a first assist feature and a second assist feature comprises indicating parameters for forming the first assist feature to have a first width and for forming the second assist feature to have a second width differing from the first width.

25. The method of claim 24 wherein the step of indicating parameters for forming a first assist feature and a second assist feature comprises indicating a symmetric location of the first and second assist feature on the reticle relative to the first primary feature and the second primary feature.

26. The method of claim 1:
   wherein the step of indicating parameters for forming at least one assist feature on the reticle comprises indicating parameters for forming a first assist feature and a second assist feature and a third assist feature; and
   wherein the step of indicating parameters for forming a first assist feature and a second assist feature and a third assist feature comprises indicating an asymmetric location of the first and third assist features on the reticle relative to the first primary feature and the second primary feature and a location of the second assist feature between the first and third assist features.

27. The method of claim 1:
   wherein the step of indicating parameters for forming at least one assist feature on the reticle comprises indicating parameters for forming a first assist feature and a second assist feature and a third assist feature; and
   wherein the step of indicating parameters for forming a first assist feature and a second assist feature and a third assist feature comprises indicating a symmetric location of the first and third assist features on the reticle relative to the first primary feature and the second primary feature and an asymmetric location of the second assist feature between the first and third assist features.

28. The method of claim 1 wherein the reticle data is for completing a bright field reticle or a dark field reticle.

29. A reticle for use in projecting an image to a semiconductor wafer, the image corresponding to a circuit design comprising a plurality of lines, the plurality of lines comprising a first line portion for use as a first circuit function and a second line portion for use as a second circuit function that differs from the first circuit function, the reticle comprising:
   at least one assist feature;
   a first primary feature; and
   a second primary feature;
   wherein the at least one assist feature, in use of the reticle for projecting the image to the semiconductor wafer, to is located at an asymmetric location between the first primary feature and the second primary feature and favors the first primary feature as compared to the second primary feature.

30. The reticle of claim 29 wherein the first line portion is for use as at least one transistor gate and the second line portion is for use other than as a transistor gate.

31. 1 The reticle of claim 30:
   wherein the at least one assist feature comprises a first assist feature and a second assist feature; and wherein the first assist feature comprises a first width and the second assist feature comprises a second width differing from the first width.

32. The reticle of claim 30 wherein the first line and the second line comprise polysilicon lines or metal lines.

33. The retiele of claim 30:
wherein the at least one assist feature comprises a plurality of assist features; and
wherein a cumulative area of the plurality of assist features between the first primary feature and the second primary feature will, when the reticle is used in projecting the image, have a greater assist feature impact on a wafer feature corresponding to the first line portion as compared to a wafer feature corresponding to the second line portion.

34. The reticle of claim 30:
wherein the at least one assist feature comprises a first assist feature and a second assist feature; and
wherein the first assist feature and the second assist feature have an asymmetric location on the reticle relative to the first primary feature and the second primary feature.

35. The reticle of claim 34 wherein the first assist feature and the second assist feature have differing widths.

36. The reticle of claim 30: wherein the at least one assist teature comprises a first assist feature and a second assist feature;
wherein the first assist feature and the second assist feature have a symmetric location on the reticle relative to the first primary feature and the second primary feature; and
wherein the first assist feature and the second assist feature have differing widths such that the asymmetric location is defined by a predominant width of either the first or second assist feature.

37. The reticle of claim 30:
wherein the at least one assist feature comprises a first assist features a second assist feature, and a third assist feature.

38. The retiele of claim 37:
wherein the first and third assist features on the reticle have an asymmetric location relative to the first primary feature and the second primary feature; and
wherein the second assist feature is located between the first and third assist features.

39. The reticle of claim 30:
wherein the first and third assist features have a symmetric location on the reticle relative to the first primary feature and the second primary feature; and
wherein a location of the second assist feature is asymmetrically located between the first and third assist features.

40. The reticle of claim 29 wherein the at least one assist feature on the reticle has an asymmetric location on the reticle between the first primary feature and the second primary feature.

41. The reticle of claim 29:
wherein the at east one assist feature is one feature in a plurality of assist features on the reticle between the first primary feature and the second primary feature; and
wherein the at least one feature has a width that differs from at least one other assist feature of the plurality of assist features.

42. The reticle of claim 29:
wherein the at least one assist feature comprises a first assist feature and a second assist feature; and
wherein the first assist feature and the second assist feature have an asymmetric location on the reticle relative to the first primary feature and the second primary feature.

43. The reticle of claim 29:
wherein the at least one assist feature comprises a first assist features and a second assist feature; and
wherein the first assist feature has a different width than the second assist feature.

44. The reticle of claim 43 wherein the first assist feature and the second assist feature have a symmetric location on the reticle relative to the first primary feature and the second primary feature such that the asymmetric location is defined by a predominant width of either the first or second assist feature.

45. The reticle of clam 29:
wherein the at least one assist feature comprises a first assist feature a second assist feature , and a third assist feature; and
wherein the first and third assist feature features have an asymmetric location on the reticle relative to the first primary feature and the second primary feature; and
wherein the second assist feature is located between the first and third assist features.

46. The reticle of claim 29:
wherein the at least one assist feature comprises a first assist features a second assist feature, and a third assist feature; and
wherein the first and third assist features have a symmetric location on the reticle relative to the first primary feature and the second primary feature; and
wherein the second assist feature is asymmetrically located between the first and third assist features.

47. The reticle of claim 29 wherein the reticle data is for completing a bright field retiele or a dark field reticle.

* * * * *